(12) United States Patent
Schaich et al.

(10) Patent No.: US 11,988,725 B2
(45) Date of Patent: May 21, 2024

(54) METHOD FOR DETERMINING A CONNECTION STATUS BETWEEN AN ANTENNA AMPLIFIER AND AN ANTENNA STRUCTURE, A DIAGNOSTIC MODULE AND AN ANTENNA AMPLIFIER

(71) Applicant: Hirschmann Car Communication GmbH, Neckartenzlingen (DE)

(72) Inventors: Peter Schaich, Nechartenzlingen (DE); Olaf Laemmle, Neckartenzlingen (DE)

(73) Assignee: Hirschmann Car Communication GmbH, Neckartenzlingen (DE)

(*) Notice: Subject to any disclaimer, the term of this patent is extended or adjusted under 35 U.S.C. 154(b) by 216 days.

(21) Appl. No.: 17/724,737

(22) Filed: Apr. 20, 2022

(65) Prior Publication Data

US 2022/0342005 A1 Oct. 27, 2022

(30) Foreign Application Priority Data

Apr. 22, 2021 (DE) .......................... 102021110345.2

(51) Int. Cl.
*G01R 31/69* (2020.01)
*H01Q 1/12* (2006.01)
*H05B 3/84* (2006.01)

(52) U.S. Cl.
CPC ........... *G01R 31/69* (2020.01); *H01Q 1/1278* (2013.01); *H05B 3/84* (2013.01)

(58) Field of Classification Search
CPC ...... G01R 31/69; G01R 31/006; G01R 31/66; G01R 31/54; G01R 19/2503; G01R 19/0038
See application file for complete search history.

(56) References Cited

U.S. PATENT DOCUMENTS 5,293,173 A 3/1994 Kropielnicki et al.
9,503,151 B2 * 11/2016 Levinger .................. H04B 1/44
(Continued)

FOREIGN PATENT DOCUMENTS

DE 19820207 A1 11/1999
DE 102008048107 A1 4/2009
(Continued)

OTHER PUBLICATIONS

Extended European Search Report dated Sep. 15, 2022 corresponding to Application No. 22165149.0-1001, 5 pages.
(Continued)

*Primary Examiner* — Dominic E Hawkins
(74) *Attorney, Agent, or Firm* — Barley Snyder

(57) ABSTRACT

A method for determining a connection status between an antenna amplifier and an antenna structure includes applying a first diagnostic voltage to a connecting link between the antenna amplifier and the antenna structure, reading out a first voltage value at a measuring point of the connecting link, and comparing the first voltage value with the first diagnostic value. The method includes applying a second diagnostic voltage different from the first diagnostic voltage to the connecting link, reading out a second voltage value at the measuring point, and comparing the second voltage value with the second diagnostic voltage. A faulty connection between the antenna amplifier and the antenna structure is determined if the first voltage value corresponds to the first diagnostic voltage and the second voltage value corresponds to the second diagnostic voltage.

18 Claims, 3 Drawing Sheets

(56) References Cited

U.S. PATENT DOCUMENTS

| | | | |
|---|---|---|---|
| 9,945,895 B2 | 4/2018 | Maruyama | |
| 2004/0116084 A1* | 6/2004 | Ward | H04B 1/18 |
| | | | 455/136 |
| 2005/0099346 A1* | 5/2005 | Gelman | H01Q 1/1271 |
| | | | 343/711 |
| 2006/0055395 A1* | 3/2006 | Rocher | G01R 31/66 |
| | | | 324/123 R |
| 2011/0237291 A1* | 9/2011 | Kirisawa | H04B 1/0466 |
| | | | 455/522 |
| 2020/0371149 A1 | 11/2020 | Malthaner et al. | |

FOREIGN PATENT DOCUMENTS

| | | |
|---|---|---|
| GB | 2266189 A1 | 10/1993 |
| JP | S4940410 A | 4/1974 |
| JP | 2005151273 A | 6/2005 |
| JP | 2009302736 A | 12/2009 |
| JP | 2010232927 A | 10/2010 |
| JP | 2015142278 A | 8/2015 |
| JP | 2016131314 A | 7/2016 |
| KR | 20110052236 A | 11/2009 |
| WO | 2005050781 A1 | 6/2005 |
| WO | 2020059172 A1 | 3/2020 |

OTHER PUBLICATIONS

Office Action from Japanese Patent Office dated Apr. 18, 2023 with English Translation thereof, corresponding to Application No. 2022-057863, 7 pages.

* cited by examiner

METHOD FOR DETERMINING A CONNECTION STATUS BETWEEN AN ANTENNA AMPLIFIER AND AN ANTENNA STRUCTURE, A DIAGNOSTIC MODULE AND AN ANTENNA AMPLIFIER

CROSS-REFERENCE TO RELATED APPLICATIONS

This application claims the benefit of the filing date under 35 U.S.C. § 119(a)-(d) of German Patent Application No. 102021110345.2, filed on Apr. 22, 2021.

FIELD OF THE INVENTION

The present invention relates to a method for determining a connection status between an antenna amplifier and an antenna structure. The present invention further relates to a diagnostic module for carrying out the method, and an antenna amplifier.

BACKGROUND

When using window heaters in vehicles in combination as heating systems and as antenna structures, it is necessary to be able to determine whether an antenna amplifier is connected to the antenna structure. For this purpose, diagnostic measurements of voltages or currents at connections between the antenna amplifier and the antenna structure are known from the prior art. However, for unambiguous interpretation of the voltage or current values measured in this way, information is required with respect to a connecting point at which the antenna amplifier is connected to the antenna structure.

SUMMARY

A method for determining a connection status between an antenna amplifier and an antenna structure includes applying a first diagnostic voltage to a connecting link between the antenna amplifier and the antenna structure, reading out a first voltage value at a measuring point of the connecting link, and comparing the first voltage value with the first diagnostic value. The method includes applying a second diagnostic voltage different from the first diagnostic voltage to the connecting link, reading out a second voltage value at the measuring point, and comparing the second voltage value with the second diagnostic voltage. A faulty connection between the antenna amplifier and the antenna structure is determined if the first voltage value corresponds to the first diagnostic voltage and the second voltage value corresponds to the second diagnostic voltage.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
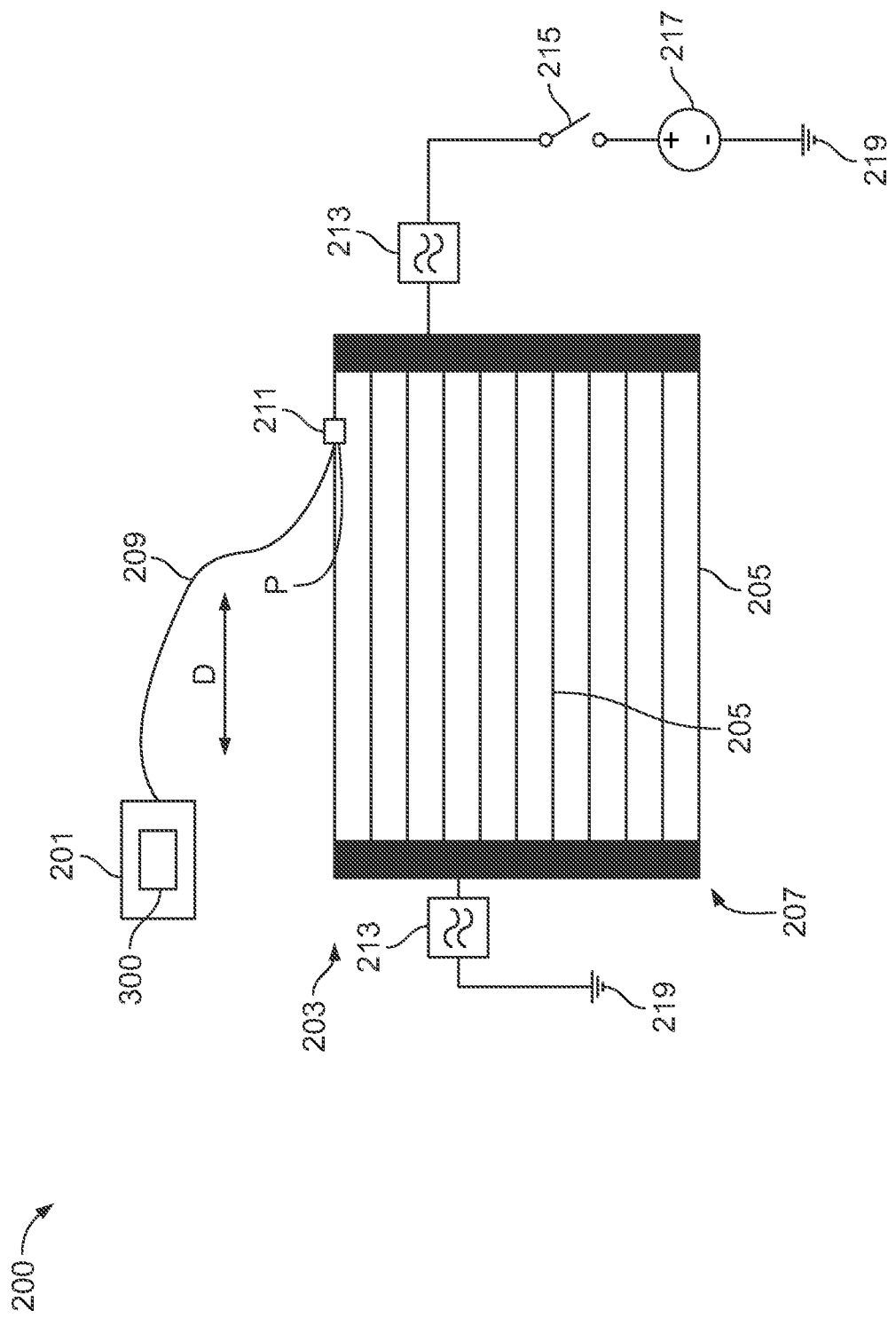
FIG. 1 is a schematic diagram of an antenna structure and an antenna amplifier according to an embodiment.

The invention shall be explained in more detail hereafter by way of example with reference to embodiments shown in the drawings. The developments and configurations shown there are each independent of one another and can be combined with one another depending on the application.

FIG. 1 depicts, schematically, an antenna system 200 comprising an antenna amplifier 201 and an antenna structure 203 according to one embodiment. In the embodiment shown, the antenna structure 203 is integrated into a window heater 207 comprising a plurality of heating wires 205, wherein the antenna structure 203 comprises at least one of the heating wires 205 of the window heater 207. Alternatively, the antenna structure 203 may comprise a plurality of the heating wires 205 or all heating wires 205 of the window heater 207. Thus, the heating wires 205 serve both as heating elements of the window heater 207 and as elements of the antenna structure 203.

The heating element 207 further comprises a voltage source 217 and a switching element 215, as shown in FIG. 1, by which the heating wires 205 may be energized and a corresponding heating effect may be achieved. Thus, via the circuit of the switching element 215, the heating wires 205 may be set to a potential of the voltage source 217 or to a potential of a ground 219.

The antenna structure 203 further comprises two filter elements 213, which are configured for example as low-pass filters, and by which it is possible to prevent high-frequency signals of the antenna structure 203 from entering the wiring of the voltage source 217 or the switching element 215 of the window heater 207.

The antenna amplifier 201 is connected to the antenna structure 203 via a connecting link 209, shown in FIG. 1. For this purpose, the connecting link 209 is arranged at a connecting point P on the antenna structure 203 via a connecting element 211. The connecting link 209 and the connecting element 211 may be formed for example as a plug element with a conductive connection line. Depending on the manufacturer of the antenna structure or the window heater 207 used, the provided connecting points P may vary along a direction D of the heating wires 205. Depending on the positioning of the connecting point P along the direction D, a potential applied to the respective connecting element 211 may vary.

In the embodiment shown, the antenna amplifier 201 further comprises a diagnostic module 300. The diagnostic module 300 is configured to carry out a method according to the present invention for determining a connection status between the antenna amplifier 201 and the antenna structure 203. A connection status is indicated here by a fault-free connection between the antenna amplifier 201 and the antenna structure 203, or by a faulty connection between the antenna amplifier 201 and the antenna structure 203.

Figure 2:
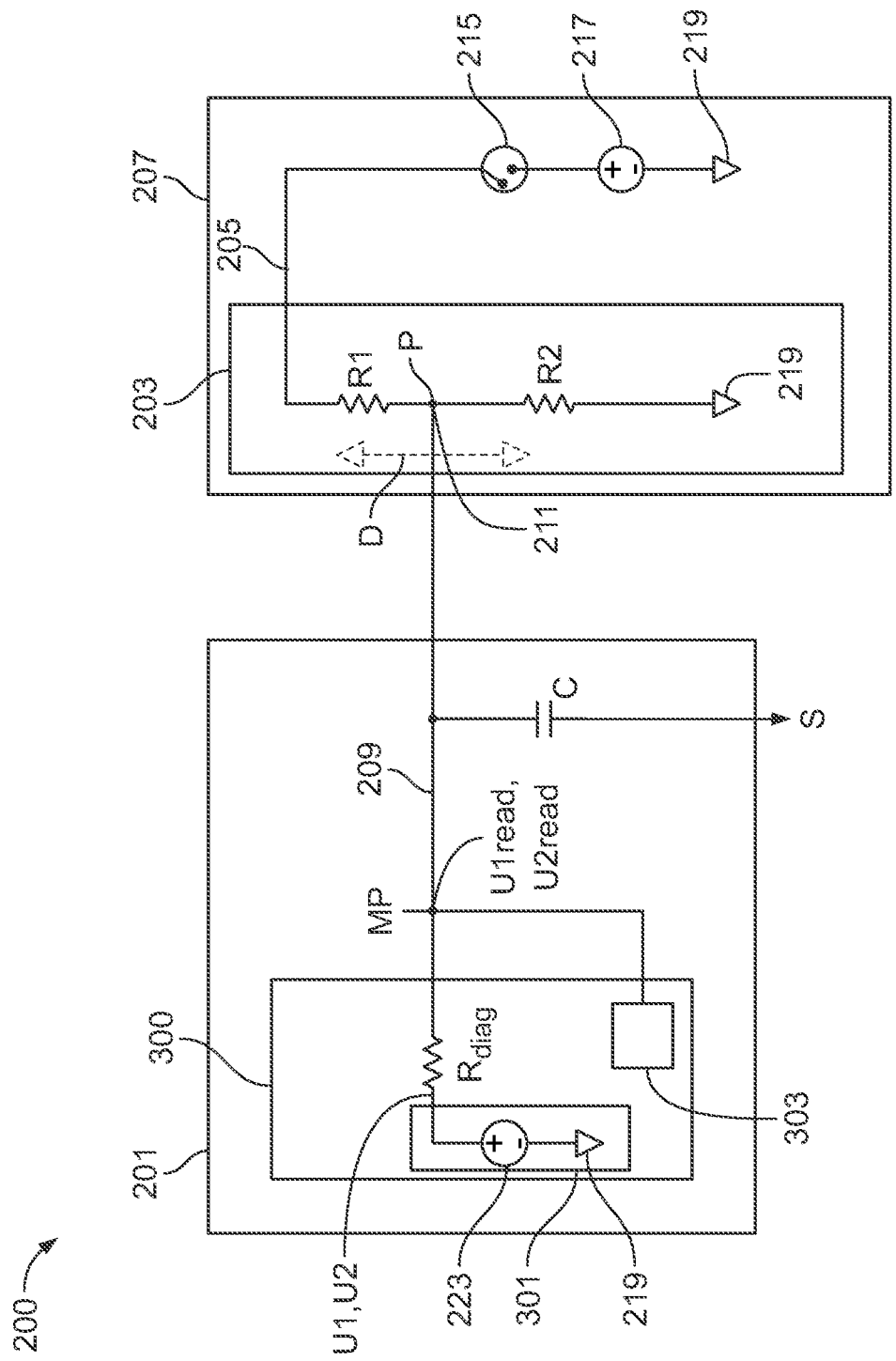
FIG. 2 is a circuit diagram of an antenna system comprising an antenna structure and an antenna amplifier.

FIG. 2 depicts an equivalent circuit diagram of an antenna system 200 comprising an antenna amplifier 201 and an antenna structure 203 according to one embodiment. The equivalent circuit diagram shown describes an antenna system 200 according to the embodiment in FIG. 1.

The antenna amplifier 201 is connected to the antenna structure 203 or window heater 207 via the connecting link 209. The connecting link 209 is connected to the antenna structure 203 at a connecting point P via the connecting element 211. In the embodiment shown, only one heating wire 205 of the antenna structure 203 or window heater 207 is shown, but this is not intended to limit the present invention. Alternatively, a plurality of heating wires 205 of the window heater 207 may be used as elements of the antenna structure 203.

Via the voltage source 217 and the switching element 215, the heating wire 205 may be correspondingly supplied with current. The heating wire 205 has electrical resistances R1, R2 which are influenced, for example, via the specific material properties and/or the length of the heating wire 205. The numerical values of the resistances R1, R2 depend in particular on a position of the connecting point P on the respective heating wire 205, via which the lengths of the two sections of the heating wire 205 are influenced.

Furthermore, via a capacitor C, an antenna signal S of the antenna structure 203 may be output which is amplified accordingly by the antenna amplifier 201.

In the embodiment shown in FIG. 2, the antenna amplifier 201 comprises the diagnostic module 300 according to the present invention. The diagnostic module 300 comprises a generation unit 301 and a readout unit 303. With the generation unit 301, diagnostic voltages U1, U2 may be generated and applied to the connecting link 209. For this purpose, the generation unit 301 comprises a voltage source 223. Here, the first and second diagnostic voltages U1, U2 are applied successively to the connecting link 209, relative to a ground potential. For this purpose, the generation unit 301 may, for example, comprise a microcontroller having a digital-to-analogue converter and/or a pulse width modulation output. Via the digital-to-analogue converter, different DC voltages may be generated as first and second diagnostic voltages U1, U2 for different sampling frequencies. Alternatively or additionally, a DC voltage may be generated from the pulse width modulation signal of the pulse width modulation output by using an additional low-pass filter. By varying the sampling frequency of the pulse width modulation output, it is thus possible to generate different DC voltages as first and second diagnostic voltages U1, U2.

The readout unit 303 is further configured to read out voltage values U1read, U2read sequentially at the connecting link 209, and to compare them with the correspondingly generated and applied diagnostic voltages U1, U2. For reading out the voltage values U1read, U2read, the readout unit 303 is connected to the connecting link 209 via a measuring point MP and is configured to read out the voltage present at the measuring point MP of the connecting link 209. The voltage at the measuring point MP is determined here as a difference in potential between a potential at the measuring point MP and a ground potential.

For comparing the read-out voltage values U1read, U2read, the readout unit 303 may comprise an analogue-to-digital converter and/or a comparator. Via the analogue-to-digital converter, the analogue voltage signals of the read-out voltage values U1read, U2read may be sampled at a corresponding sampling frequency and converted into a digital signal. The digital signal may then be processed by the microcontroller and/or compared with the respectively applied first or second diagnostic voltage U1, U2 by the comparator.

The measurement point MP, at which the readout unit 303 reads out the voltage applied to the connecting link 209, may be positioned between a diagnostic resistor Rdiag of the diagnostic module 300 which is connected to the connecting link 209, and the connecting point P at the connecting link 209. In this case, the diagnostic resistor Rdiag must be formed having a substantially higher resistance value than the resistances R1, R2 of the elements of the antenna structure 203. The elements of the antenna structure 201 may be provided in particular by the heating wires 205 of the window heater 207. As a result of the high value of the diagnostic resistor Rdiag in comparison with the resistances R1, R2, it is possible to prevent a current flow between the diagnostic module 300 and the antenna structure 203 due to the applied diagnostic voltages U1, U2. In addition, the diagnostic resistor Rdiag makes it possible to read off different voltage values at the measuring point MP as a function of a voltage applied to the antenna structure 203.

As described with reference to FIG. 1, the connecting point P, at which the antenna amplifier 201 is connected to the antenna structure 203, may vary for different manufacturers along the direction D of the heating wires 205, whereby the potential arising at the corresponding connecting element 211 may likewise assume different values.

In order to determine a connection status between the antenna amplifier 201 and the antenna structure 203 which indicates whether or not the antenna amplifier 201 is connected to the antenna structure 203, a first diagnostic voltage U1 is generated by the generation unit 301 of the diagnostic module 300 and applied to the connecting link 209. Via the readout unit 303, a corresponding first voltage value U1read is read out at the measuring point and compared with the first diagnostic voltage U1. The first voltage value U1read is read out at a time at which the first diagnostic voltage U1 is applied.

If the read-out first voltage value U1read differs from the applied first diagnostic voltage U1, then a fault-free connection between the antenna amplifier 201 and the antenna structure 203 may be determined.

A deviation may occur here taking into consideration a limit value, so that voltage values U1read, U2read differ from the respective diagnostic voltage U1, U2 if a difference between the respectively applied diagnostic voltage and the respective measured voltage value is greater than the limit value. On the other hand, a read-out voltage value U1read, U2read corresponds to the respective diagnostic voltage U1, U2 if a difference between the voltage value U1read, U2read and the diagnostic voltage U1, U2 is less than or equal to the limit value.

In the circuit shown in FIG. 2, in particular taking into consideration the diagnostic resistor Rdiag and the measuring point MP arranged between the diagnostic resistor Rdiag and the connecting point P, and by determining the voltage values U1read, U2read relative to a ground potential, in the case of a fault-free connection of the antenna amplifier 201 to the antenna structure 203 via the connecting point P, a voltage corresponding to the voltage present at the antenna structure 203 is measured by the readout unit 303 at the measuring point MP. In this case, the voltage value U1read, U2read which is read out at the measuring point MP is independent of the respective applied diagnostic voltage U1, U2 in the case of a fault-free connection of the antenna amplifier 201 to the antenna structure 203. In the case of the antenna amplifier 201 being connected, in which there is an electrical connection between the antenna amplifier 201 and the antenna structure 203, and in which there is thus an electrical connection between the measurement point MP and the connecting point P, a potential at the measurement point MP corresponds to a potential at the connecting point P. Thus, a voltage measurement at the measurement point MP determines a potential of the connecting point P.

However, in the case of a faulty connection of the antenna amplifier 201 to the antenna structure 203, there is no electrical connection between the measuring point MP and the connecting point P. If a voltage is measured at the measuring point MP, the potential at the measuring point MP is thus primarily influenced by the applied diagnostic voltage U1, U2.

In the case of a faulty connection in which the antenna amplifier 201 for example is not connected to the antenna structure 203, it would therefore be expected that the read-out voltage value U1read corresponds to the applied first diagnostic voltage U1. Due to the circuit described above having the Rdiag which is substantially higher in resistance in comparison to the resistances R1, R2 of the antenna structure 203 and the measuring point MP as arranged above, the readout unit 303 primarily measures the respective applied diagnostic voltage U1, U2 in the case of a faulty connection of the antenna amplifier 201 to the antenna structure 203 at the measuring point MP.

However, if the first voltage value U1read corresponds to the first diagnostic voltage U1, it cannot yet be clearly determined at this point that there is a faulty connection between the antenna amplifier 201 and the antenna structure 203. Since, in the case of a faulty connection at the measuring point MP, the applied diagnostic voltage U1 is read out, while in the case of a fault-free connection at the measuring point, the voltage of the antenna structure 203 is read out, a correspondence of the first voltage value U1read to the first diagnostic voltage U1 may be effected by a faulty connection or by a fault-free connection, wherein, in the case of a fault-free connection, a voltage applied to the antenna structure additionally matches the diagnostic voltage U1. This may occur in particular during operation of the window heater 207, in which the switching element 215 of the window heater 207 is closed and the heating wires 205 are energized via the voltage source 217. Depending on the design/dimensioning of the voltage source 217 and the characteristics of the window heater 207 and the heating wires 205, due to the operation of the window heater 207, there may be a voltage drop at the connecting point P which corresponds to the applied diagnostic voltage U1. Thus, without knowledge of the switching state of the switching element 215 or the operating state of the window heater 207, a clear conclusion cannot be made based on the first measurement.

According to the present invention, in the case that the read-out first voltage value U1read corresponds to the applied first diagnostic voltage, a second diagnostic voltage U2 which differs from the first diagnostic voltage U1 is thus generated by the generation unit 301 and applied to the connecting link 209. A second voltage value U2read is correspondingly read out by the readout unit 303 and compared with the applied second diagnostic voltage U2, wherein the readout is again performed at a time at which the second diagnostic voltage U2 is applied.

If the read-out second voltage value U2read corresponds to the applied second diagnostic voltage U2, a faulty connection between the antenna amplifier 201 and the antenna structure 203 is determined. In such a case, both the first read-out voltage value U1read corresponds to the first applied diagnostic voltage U1, and the second read-out voltage value U2read corresponds to the second applied diagnostic voltage U2. Since the first and second diagnostic voltages U1, U2 are different, such a result is independent of the switching state and the potential of the switching element 215 of the window heater 207 and may be caused solely by a faulty connection between the antenna amplifier 201 and the antenna structure 203. A change in the voltage of the antenna structure 203 may be ruled out in this case, since the window heater 207 is operated at a constant operating voltage and the connecting point P remains unchanged.

The faulty connection determined in such a way may be based for example on a faulty connection or a defect in the connecting link 209. The detection of a faulty connection is thus not limited to damage to the connecting link 209, but also enables the detection of a faulty connection of the antenna amplifier 201.

On the other hand, if the read-out second voltage value U2read differs from the applied second diagnostic voltage U2, then a fault-free connection between the antenna amplifier 201 and the antenna structure 203 may be clearly determined. Since, as described above, in the case of a faulty connection at the measuring point MP, primarily the applied diagnostic voltage U2 is measured, not the voltage of the antenna structure 203, a deviation of the measured voltage values from the respective applied voltage can only be interpreted with a fault-free connection in which, as described above, primarily the voltage of the antenna structure 203 is measured at the measuring point MP.

According to one embodiment, the diagnostic voltages U1, U2 and correspondingly the read-out voltage values U1read, U2read, are configured as DC voltages.

The antenna structure 203 and the window antenna 207 may be integrated in particular into a rear window, a front window or a side window of a vehicle.

Figure 3:
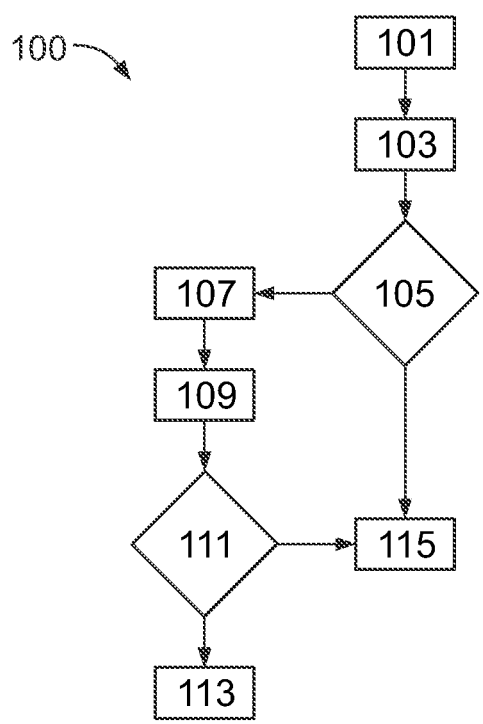
FIG. 3 is a flowchart of a method for determining a connection status between an antenna amplifier and an antenna structure.

FIG. 3 shows a flowchart of a method 100 for determining a connection status between an antenna amplifier 201 and an antenna structure 203, according to one embodiment. The method 100 according to the present invention for determining a connection status between an antenna amplifier 201 and an antenna structure 203 may be applied to an antenna system 200 according to FIGS. 1 and 2 and carried out by a corresponding diagnostic module 300.

To determine the connection status, in a first step 101, a first diagnostic voltage U1 is first applied to the connecting link 209.

In a method step 103, a first voltage value U1read is read out at the connecting link 209. The first voltage value U1read is read out at a time at which the first diagnostic voltage U1 is applied to the connecting link 209. In this case, the first voltage value U1read is read out at a measuring point MP on the connecting link 209 and determined as a difference in potential between a potential at the measuring point MP and a ground potential.

In a method step 105, the read-out first voltage value U1read is compared with the applied first diagnostic voltage U1.

If the comparison shows that the read-out first voltage value U1read differs from the applied first diagnostic voltage U1, a fault-free connection between the antenna amplifier 201 and the antenna structure 207 is determined in a method step 115.

If, however, the comparison in method step 105 shows that the read-out first voltage value U1read corresponds to the applied first diagnostic voltage U1, then, in a method step 107, a second diagnostic voltage U2 which is different from the first diagnostic voltage U1 is applied to the connecting link 209.

In a method step 109, a second voltage value U2read is read out at the connecting link 209, wherein said voltage value is read out analogously to the first voltage value U1read at the measuring point MP and determined as a difference in potential between the potential of the measuring point and the ground potential. The second voltage value U2read is read at a time at which the second diagnostic voltage U2 is applied to the connecting link 209.

In a method step 111, the read-out second voltage value U2read is compared with the applied second diagnostic voltage U2.

If the comparison in method step 111 shows that the read-out second voltage value U2read differs from the applied second diagnostic voltage U2, a fault-free connection between the antenna amplifier 201 and the antenna structure 203 is determined in method step 115.

If, however, the comparison in method step 111 shows that the read-out second voltage value U2read corresponds to the applied second diagnostic voltage U2, a faulty connection between the antenna amplifier 201 and the antenna structure 203 is determined in a method step 113.

A diagnostic result with respect to the connection status according to the results of method steps 113, 115 may be displayed to a user according to a corresponding diagnostic message or by a diagnostic signal.

The method 100 according to the present invention may be carried out cyclically during an operation of the antenna amplifier 201 or the antenna structure 203, so that a corresponding connection status of the antenna amplifier 201 with the antenna structure 203 may be continuously displayed to a user via a corresponding status message or a corresponding status signal. Alternatively or additionally, by carrying out the method 100, a corresponding connection status may be displayed to the user during a switch-on operation of the antenna amplifier 201 or the antenna structure 203.

In deviation from the procedure described above, a plurality of different diagnostic voltages having respectively different values may be generated, applied to the connecting link 209, and corresponding voltage values may be read out and compared with the respective diagnostic voltages.

Through the use of the different diagnostic voltages U1, U2, it is possible to avoid the case in which, by chance, a diagnostic voltage U1, U2 applied to the connecting link 209 for determining the connection status corresponds to a potential of a switching element 215 of the window heater 207. In such a case, in which the applied diagnostic voltage U1, U2 corresponds to the potential of the switching element 215, it would not be possible to distinguish whether a faulty connection exists between the antenna amplifier 201 and the antenna structure 203, or whether a fault-free connection exists between the antenna amplifier 201 and the antenna structure 203, but the switching element 215 of the window heater 207 is switched to the closed state, and thus the potential of the switching element 215 corresponds to the applied diagnostic voltage U1, U2. In both cases, a correspondingly measured voltage value U1read, U2read would correspond to the respectively applied diagnostic voltage U1, U2.

By using two different diagnostic voltages U1, U2, the faulty connection between the antenna amplifier 201 and the antenna structure 203 may be clearly determined if the measured voltage values U1read, U2read respectively correspond to the two different diagnostic voltages U1, U2. In addition, by the method according to the present invention, it is possible to determine a connection status without knowledge of a connecting point P at which the antenna amplifier 201 is connected to the antenna structure 203 via the connecting link 209. The method according to the present invention is thus applicable to any antenna structures having different connecting points at which corresponding antenna amplifiers can be connected.

What is claimed is:

1. A method for determining a connection status between an antenna amplifier and an antenna structure, comprising:
    applying a first diagnostic voltage to a connecting link between the antenna amplifier and the antenna structure;
    reading out a first voltage value at a measuring point of the connecting link, the first voltage value is determined as a difference in potential between a potential at the measuring point of the connecting link and a ground potential;
    comparing the first voltage value with the first diagnostic value;
    applying a second diagnostic voltage different from the first diagnostic voltage to the connecting link;
    reading out a second voltage value at the measuring point, the second voltage value is determined as a difference in potential between the potential at the measuring point and the ground potential;
    comparing the second voltage value with the second diagnostic voltage; and
    determining a faulty connection between the antenna amplifier and the antenna structure if the first voltage value corresponds to the first diagnostic voltage and the second voltage value corresponds to the second diagnostic voltage.

2. The method of claim 1, further comprising determining a fault-free connection between the antenna amplifier and the antenna structure if the first voltage value differs from the first diagnostic voltage and/or if the second voltage value differs from the second diagnostic voltage.

3. The method of claim 1, wherein the faulty connection is indicated if the antenna amplifier is not connected to the antenna structure via a connecting element.

4. The method of claim 1, wherein the first diagnostic voltage and the second diagnostic voltage are applied to the connecting link via a diagnostic resistor.

5. The method of claim 1, wherein at least one of the first diagnostic voltage, the second diagnostic voltage, the first voltage value, and the second voltage value is a DC voltage.

6. The method of claim 1, wherein the method is carried out cyclically during an operation of the antenna amplifier and the antenna structure.

7. The method of claim 1, wherein the method is carried out during a switch-on operation of the antenna amplifier and/or the antenna structure.

8. The method of claim 1, wherein the antenna structure is a window antenna for a vehicle.

9. The method of claim 8, wherein the window antenna has a heating wire of a window heater.

10. The method of claim 9, wherein the antenna structure and the window heater are integrated into a rear window, a front window, or a side window of the vehicle.

11. A diagnostic module determining a connection status between an antenna amplifier and an antenna structure, comprising:
    a generation unit generating a plurality of diagnostic voltages; and
    a readout unit reading out a plurality of voltage values and comparing the voltage values to the diagnostic voltages, the generation unit and the readout unit carry out the method of claim 1.

12. The diagnostic module of claim 11, wherein the generating unit has a microcontroller, the microcontroller has a digital-to-analogue converter and/or a pulse width modulation output.

13. The diagnostic module of claim 12, wherein the microcontroller generates the first diagnostic voltage and the second diagnostic voltage.

14. The diagnostic module of claim 11, wherein the readout unit has an analogue-to-digital converter and/or a comparator.

15. The diagnostic module of claim 14, wherein the readout unit compares the first voltage value with the first diagnostic voltage and compares the second voltage value with the second diagnostic voltage.

16. The diagnostic module of claim 11, further comprising a diagnostic resistor having a resistance higher than a plurality of resistances of the antenna structure.

17. An antenna amplifier, comprising:
a diagnostic module according to claim 11 integrated into the antenna amplifier.

18. An antenna system, comprising:
an antenna amplifier;
an antenna structure integrated into a heating element for a vehicle; and
a diagnostic module according to claim 11.

* * * * *